US008290736B2

(12) United States Patent
Tang

(10) Patent No.: US 8,290,736 B2
(45) Date of Patent: Oct. 16, 2012

(54) CALIBRATION STANDARDS AND METHODS OF THEIR FABRICATION AND USE

(75) Inventor: Jinbang Tang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 339 days.

(21) Appl. No.: 12/710,497

(22) Filed: Feb. 23, 2010

(65) Prior Publication Data

US 2011/0208467 A1    Aug. 25, 2011

(51) Int. Cl.
*G01R 31/02* (2006.01)

(52) U.S. Cl. .................... 702/117; 324/750.02; 324/754; 324/755.01

(58) Field of Classification Search .................. 702/57, 702/65, 74, 85, 117, 118; 324/601, 750.02, 324/754, 755.01, 762.02; 257/48
See application file for complete search history.

(56) References Cited

U.S. PATENT DOCUMENTS

| | | | | |
|---|---|---|---|---|
| 6,480,013 | B1 * | 11/2002 | Nayler et al. | 324/750.02 |
| 7,439,748 | B2 | 10/2008 | Kamitani | |
| 7,764,072 | B2 * | 7/2010 | Strid et al. | 324/755.01 |
| 2009/0051380 | A1 | 2/2009 | Chladek et al. | |
| 2010/0264948 | A1 * | 10/2010 | Strid et al. | 324/754 |

OTHER PUBLICATIONS

Fenton J. Randy, Validation of On-Wafer Vector Network Analyzer Systems, IEEE 68th ARFTG, Dec. 2006.
Hayden, Leonard, A Hybrid Probe-Tip Calibration for Multiport Vector Network Analyzers, IEEE 68th ARFTG, Dec. 2006.
Cascade Microtech, A Guide to Better Vector Network Analyzer Calibrations for Probe-Tip Measurements, Technical Brief, TECHBRIEF4-0694, 1994.
Cascade Microtech, Vector Network Analyzer Calibration with the Surrogate Chip Kit, Technical Brief, TECHBRIEF5-0694, 1994.
Cascade Microtech, Pyramid-WM, Specification Sheet, PYR-MM-SS 0609, 2009.
Cascade Microtech, On-Wafer Vector Network Analyzer Calibration and Measurements, Application Brief, Jan. 22, 2007.
Cascade Microtech, Inc., Impedance Standard Substrate, Oct. 7, 2008.
* cited by examiner

*Primary Examiner* — John H Le
(74) *Attorney, Agent, or Firm* — Sherry W. Schumm

(57) ABSTRACT

An embodiment of a calibration standard includes a substrate, a set of conductive structures fabricated on the substrate, and a conductive end structure fabricated on the substrate. The set of conductive structures include an inner conductive structure, a first outer conductive structure positioned to one side of the inner conductive structure, and a second outer conductive structure positioned to an opposite side of the inner conductive structure. The inner and outer conductive structures are aligned in parallel with each other along offset principal axes of the inner and outer conductive structures. The conductive end structure is electrically connected between an end of the first outer conductive structure and an end of the second outer conductive structure, and the conductive end structure is spatially separated from an end of the inner conductive structure at the surface of the substrate.

25 Claims, 7 Drawing Sheets

CALIBRATION STANDARDS AND METHODS OF THEIR FABRICATION AND USE

TECHNICAL FIELD

Embodiments relate to calibration standards configured for use in determining electrical characteristics of testing systems, and methods for fabricating and using such standards.

BACKGROUND

During integrated circuit device design and manufacture, it may be desirable to determine a device's electrical characteristics through testing procedures. For example, an integrated circuit device may be modeled as a two-port network (e.g., a network having an input port and an output port), and the device's electrical characteristics may be determined by providing excitation signals at one port and measuring either reflected signals at the same port or transmitted signals at the other port. Such testing methods may be used to determine various electrical parameters that characterize the device, such as S-parameters (scattering), Y-parameters (conductance), Z-parameters (resistance), and H-parameters (conductance and resistance). For devices that operate at radio frequencies (RF), S-parameters are generally easier to measure than other parameters.

A typical testing system may include a Vector Network Analyzer (VNA), probes, and coaxial cables connected between the probes and the VNA's ports. Each probe may include multiple probe tips. For example, a ground-signal-ground (GSG) type of probe may include three probe tips (e.g., one tip connected to signal and two tips connected to ground). Conversely, a ground-signal (GS) type of probe may include just two probe tips (e.g., one tip connected to ground and one tip connected to signal). The electrical parameters of a device under test (DUT) may be determined by touching the probes to pads associated with the device's input and output ports, and controlling the VNA to provide excitation signals and measure responsive signals at the DUT ports. The excitation and responsive signals may then be evaluated to determine the parameters.

Desirably, the electrical parameters determined by the testing system represent only the electrical characteristics of the DUT, and not the electrical characteristics of the testing system. However, the VNA, cabling, and probes may contribute significant errors to the test results. Therefore, prior to DUT testing, a calibration procedure typically is performed in order to determine an error model for the testing system. The error model may be derived from measurements taken during exposure of the testing system probes to electrically shorted conditions, open conditions, load conditions, and thru conditions. Once the error model is determined, it may be used to adjust measurements or parameters determined during actual DUT testing, in order to negate the signal effects that are contributed by the testing system.

A VNA calibration procedure may be performed using calibration "standards," which consist of various conductive patterns fabricated on a semiconductor wafer (e.g., a wafer containing the DUT) or on a separate substrate. For example, FIG. 1 illustrates a conventional set of calibration standards 100, which include a first conductive pattern 102 for testing a shorted condition, a second conductive pattern 103 for testing a load condition, and a third conductive pattern 104 for testing a thru condition. FIG. 1 also illustrates GSG probes 110, 112 contacting each of patterns 102-104. The first conductive pattern 102 is a "short-type" calibration standard, which includes two low-resistance conductive strips 120, 121 oriented in a vertical direction, with respect to FIG. 1. When probes 110, 112 accurately contact the first conductive pattern 102, as illustrated, the tips of each probe 110, 112 are shorted together. The second conductive pattern 103 is a "load-type" calibration standard, which includes probe contact pads 122, each separated by known resistance loads 123 (e.g., 50 ohm loads). When probes 110, 112 accurately contact the probe contact pads 122 of the second conductive pattern 103, as illustrated, a load is presented between adjacent probe tips of each probe 110, 112. Finally, the third conductive pattern 104 is a "thru-type" calibration standard, which includes three low-resistance conductive strips 124, 125, 126 oriented in a horizontal direction, with respect to FIG. 1. When probes 110, 112 accurately contact the third conductive pattern 104, as illustrated, corresponding probe tips of probes 110, 112 are electrically connected together. By performing multiple excitation and measurement procedures using the various calibration standards 100, the electrical characteristics of the testing system may be measured, and an error model for the testing system may be determined.

Although the illustrated and described calibration standards may provide sufficient calibration accuracy in many cases, they may not provide adequate accuracy in others (e.g., when the conductive patterns are fabricated on relatively high dielectric, "electrically thick" substrates). In addition, the conductive patterns may exhibit "end effects," which may compromise the accuracy of the calibration method.

BRIEF SUMMARY

Various embodiments of calibration standards and methods for their fabrication and use are disclosed. An embodiment includes a set of calibration standards comprising a substrate having a surface, a first set of first conductive structures fabricated on the surface of the substrate, and a first conductive end structure. The first conductive structures include a first inner conductive structure, a first outer conductive structure positioned to one side of the first inner conductive structure, and a second outer conductive structure positioned to an opposite side of the first inner conductive structure. The first conductive structures are aligned in parallel with each other along offset principal axes of the first conductive structures. The first conductive end structure is electrically connected between a first end of the first outer conductive structure and a first end of the second outer conductive structure, and the first conductive end structure is spatially separated from a first end of the first inner conductive structure at the surface of the substrate.

Another embodiment includes a method for fabricating a set of calibration standards. The method comprises the steps of providing a substrate having a surface, forming a first set of first conductive structures on the surface of the substrate, and forming a first conductive end structure on the surface of the substrate. The first conductive structures include a first inner conductive structure, a first outer conductive structure positioned to one side of the first inner conductive structure, and a second outer conductive structure positioned to an opposite side of the first inner conductive structure. The first conductive structures are aligned in parallel with each other along offset principal axes of the first conductive structures. The first conductive end structure is electrically connected between a first end of the first outer conductive structure and a first end of the second outer conductive structure, and the first conductive end structure is spatially separated from a first end of the first inner conductive structure at the surface of the substrate.

Yet another embodiment includes a method for using a set of calibration standards with a testing system configured to test electrical characteristics of an integrated circuit device. The method comprises the steps of providing a set of calibration standards, contacting probes of the testing system with probe contact areas of the calibration standards, providing excitation signals through the probes, measuring responsive signals through the probes, and analyzing the responsive signals to determine electrical characteristics of the testing system. The set of calibration standards includes a substrate having a surface, a first set of first conductive structures fabricated on the surface of the substrate, and a first conductive end structure. The first conductive structures include a first inner conductive structure, a first outer conductive structure positioned to one side of the first inner conductive structure, and a second outer conductive structure positioned to an opposite side of the first inner conductive structure. The first conductive structures are aligned in parallel with each other along offset principal axes of the first conductive structures. The first conductive end structure is electrically connected between a first end of the first outer conductive structure and a first end of the second outer conductive structure, and the first conductive end structure is spatially separated from a first end of the first inner conductive structure at the surface of the substrate.

DETAILED DESCRIPTION

Embodiments include calibration standards configured for use in determining electrical characteristics of testing systems, and methods for fabricating and using such standards. More particularly, calibration standards of the various embodiments may be used to determine electrical characteristics of a testing system, and the testing system electrical characteristics may, in turn, be used to generate an error model for the testing system. When the testing system is subsequently used to determine electrical characteristics of an integrated circuit device (e.g., a "device under test" or "DUT"), measured electrical characteristics of the device under test may be adjusted based on the error model of the testing system, in order to produce compensated measurements, which may more accurately reflect the electrical characteristics of the DUT.

Figure 1:
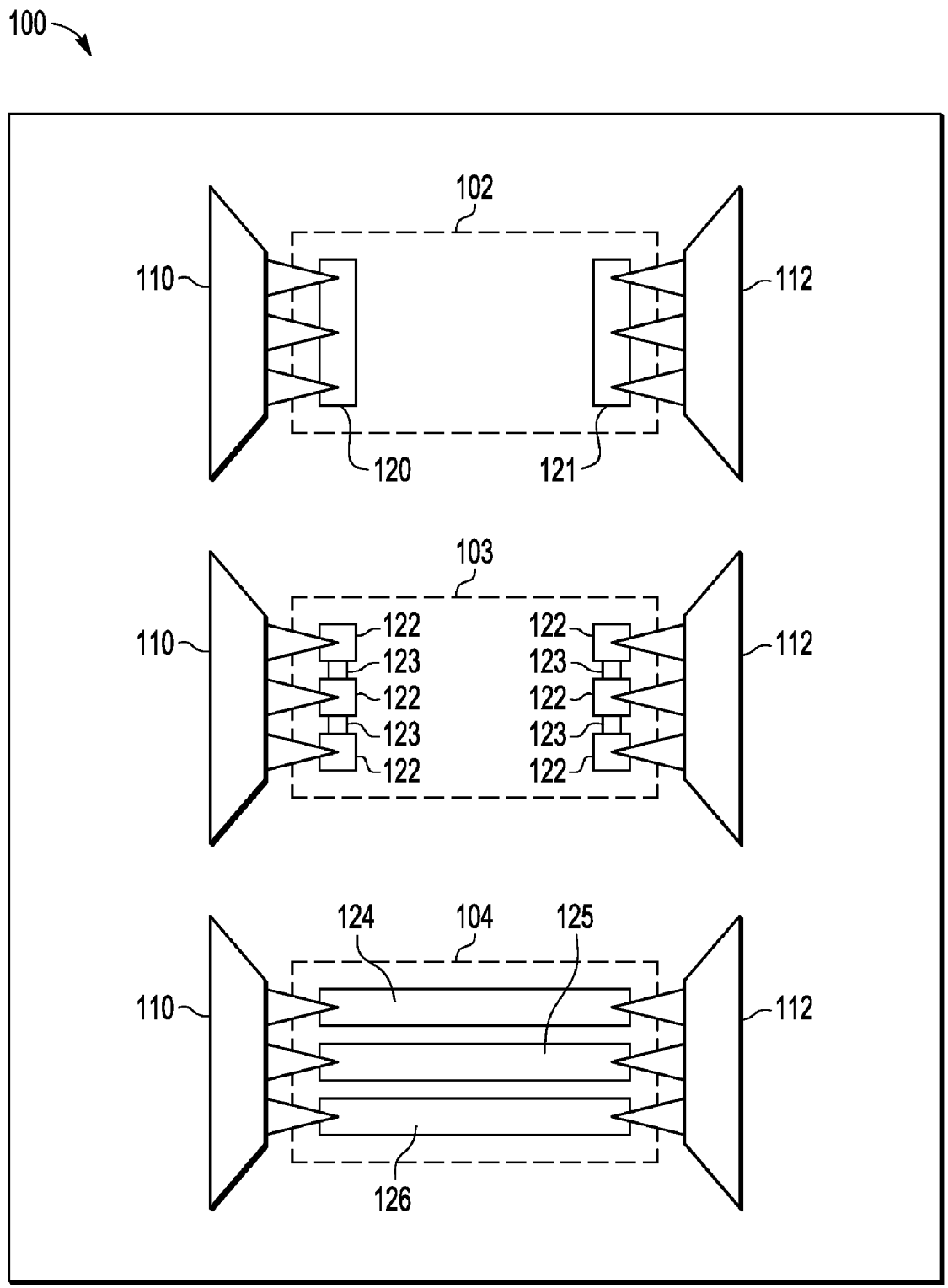
FIG. 1 illustrates a set of conventional calibration standards.
Figure 2:
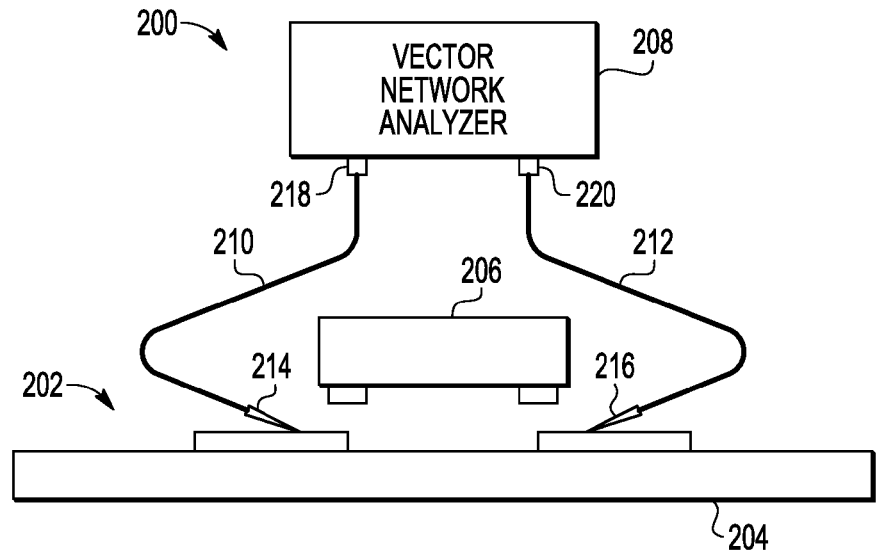
FIG. 2 illustrates a testing system and a calibration standard included on a substrate that is separate from an integrated circuit device to be tested, according to an example embodiment.

FIG. 2 illustrates a testing system 200 and calibration standard 202 included on a substrate 204 that is separate from an integrated circuit (IC) device 206 to be tested or used during a calibration procedure, according to an example embodiment. Testing system 200 is configured to determine the electrical characteristics of IC devices (e.g., IC 206), and thus may be accurately referred to as an IC device electrical characterization testing system. According to an embodiment, testing system 200 is particularly configured to determine S-parameters of an IC, although testing system 200 may be configured to determine other parameters (e.g., Y-parameters, Z-parameters, and H-parameters), as well.

As indicated previously, an IC may be modeled using a two-port network model (e.g., the IC may be represented as a network including an input port and an output port). According to such a model, S-parameters may be defined to include an input reflection coefficient parameter ($S_{11}$), an output reflection coefficient parameter ($S_{22}$), a forward transmission gain parameter ($S_{21}$), and a reverse transmission gain parameter ($S_{12}$), where "1" indicates the IC's input port and "2" indicates the IC's output port. To measure the input reflection coefficient parameter ($S_{11}$) of the IC, for example, the output port may be terminated by a matched load, and an excitation signal ($a_1$) may be provided to the input port. A responsive, reflected signal ($b_1$) at the input port may then be measured, and the ratio of the reflected signal to the excitation signal may define the input reflection coefficient parameter ($S_{11}$). The output reflection coefficient parameter ($S_{22}$) may be similarly measured at the IC's output port. To measure the forward transmission gain parameter ($S_{21}$), an excitation signal may be provided at the input port, and a responsive signal transmitted through the IC may be measured at the output port. Again, the ratio of the responsive signal to the excitation signal may define the forward transmission gain parameter. The reverse transmission gain parameter ($S_{12}$) may be similarly measured by providing the excitation signal instead at the IC's output port, and measuring the responsive signal at the input port.

Referring again to FIG. 2, substrate 204 may be, for example, a printed circuit board, a semiconductor wafer or another type of rigid structure conducive to providing structural support for a calibration standard (e.g., calibration standard 202). According to an embodiment, substrate 204 may include an embedded ground structure (e.g., a ground plane positioned below a top surface of the substrate 204) to which portions of calibration standard 202 may be electrically connected.

Calibration standard 202 includes one or more thin-film, electrically conductive structures fabricated on a surface (e.g., a top surface) of substrate 204. Calibration standard 202 may be any one of a number of different types of calibration standards, including a thru-type, line-type, short-type, open-type and load-type calibration standard. As will be described in more detail in conjunction with FIGS. 4-8, calibration standards in accordance with various embodiments include one or more conductive end structures. These conductive end structures may provide an advantage of mitigating end effects that are characteristic of traditional calibration standards, thus enabling a potential reduction in inaccuracies that may otherwise be inherent in calibration procedures. Although only a single calibration standard 202 is illustrated in FIG. 2, it is to be understood that multiple calibration standards of the same or different types may be fabricated on substrate 204.

Testing system 200 includes a vector network analyzer 208 (VNA), cables 210, 212, and probes 214, 216. Cables 210, 212 and probes 214, 216 are connected to VNA 208 through ports 218, 220 of VNA 208. In the illustrated testing system, VNA 208 is configured as a two-port testing system. Alternatively, four ports (or some other number of ports) may be utilized.

Prior to testing an IC having unknown electrical properties (e.g., IC 206), a calibration procedure may be performed to determine electrical characteristics (and an error model) for testing system 200. VNA 208 is electrically connected to calibration standard 202 through ports 218, 220, cables 210, 212, and probes 214, 216. The tips of probes 214, 216 may be considered to define a "reference plane," which corresponds to a boundary between testing system 200 and calibration standard 202. VNA 208 may then provide excitation signals and may measure responsive signals, and may determine vector ratios of reflected or transmitted energy to energy incident upon calibration standard 202. In order to generate and convey the incident energy (e.g., the excitation signal) to one of ports 218, 220, VNA 208 may include a radio frequency (RF) source and a forward/reverse switch (not illustrated). In addition, to retrieve forward and reverse waves traveling to and from each port, VNA 208 may include directional couplers or bridges (also not illustrated). During testing, the forward/reverse switch may direct an RF excitation signal either through port 218, cable 210, and probe 214 or through port 220, cable 212, and probe 216. The directional couplers or bridges retrieve the forward and reverse waves traveling to and from each port. These signals may be down-converted, filtered, amplified, and digitized for further processing.

The ratios of the wave amplitudes of the excitation signals provided by VNA 208 and the responsive signals measured by VNA 208 correspond to the S-parameters of the testing system 200 (e.g., $b_1/a_1 = S_{11}$ of testing system 200). Accordingly, the calibration procedure results in a determination of the electrical characteristics of the testing system 200 alone. The electrical characteristics of the testing system 200 may be use to generate an error model for the testing system 200, which may be used during subsequent testing of ICs having unknown characteristics (e.g., IC 206). More particularly, the electrical characteristics and/or error model of testing system 200 may be used to adjust electrical characteristic measurements generated during testing of IC 206 to effectively eliminate the electrical characteristics of testing system 200. Accordingly, more accurate measurements of the electrical characteristics of IC 206 may be obtained.

To establish a setup for testing IC 206, pads of IC 206 that are associated with input and output ports of IC 206 are designed by referring to the port design of calibration standards (e.g., calibration standard 202). The electrical connection made between IC 206 and calibration standard 202 may depend on the type of packaging of IC 206. For example, when IC 206 is packaged in a "flip-chip" type of package (as illustrated), the input/output pads of IC 206 may be aligned with and brought into contact with appropriate points of the calibration standard 202. Conversely, when an IC is packaged in a wirebond type of package, wirebonds or other conductive connectors may be attached between the IC's bond pads and appropriate points of the calibration standard.

In the embodiment illustrated in FIG. 2, calibration standard 202 is fabricated on a substrate 204 that is separate and distinct from IC 206. In an alternate embodiment, calibration standards may be fabricated on the same substrate (e.g., a wafer) as a device that ultimately is to be tested.

Figure 3:
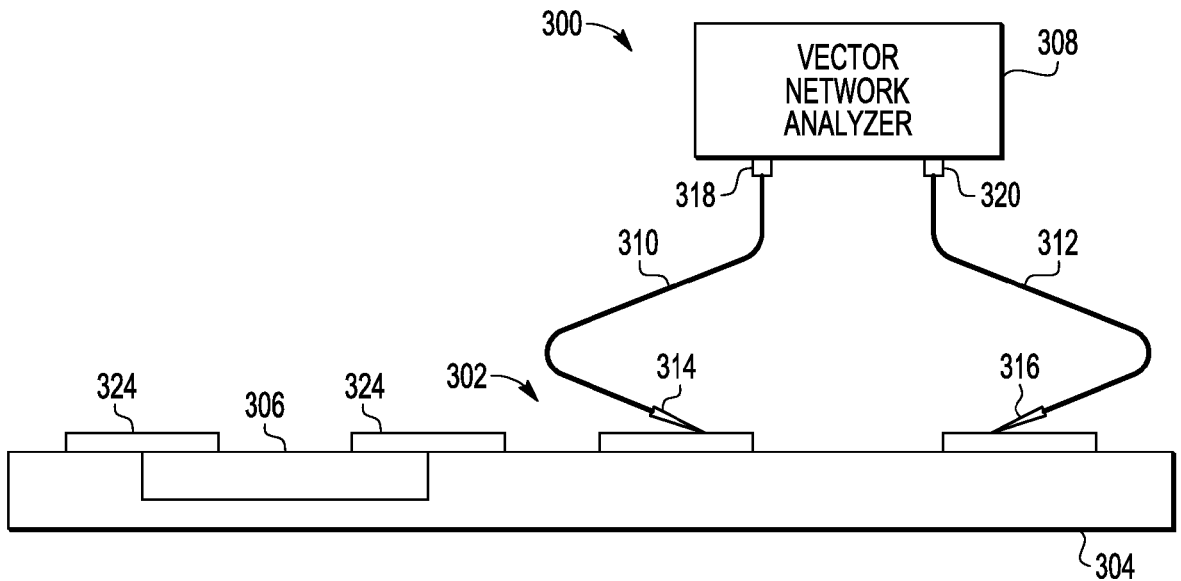
FIG. 3 illustrates a testing system and a calibration standard included on a wafer containing an integrated circuit device, according to an alternate embodiment.

FIG. 3 illustrates a testing system 300 and a calibration standard 302 included on a wafer 304 containing an IC device 306 to be tested, according to an alternate embodiment. Wafer 304 may, for example, be formed from a semiconductor material, such as silicon, gallium arsenide or other III-V or II-VI type materials. According to an embodiment, wafer 304 has a thickness in a range of about 100 micrometers (μm) to about 1000 μm, although wafer 304 may be thicker or thinner, in other embodiments. In addition, the semiconductor material of wafer 304 has a dielectric constant in a range of about 11-12, according to an embodiment, although the semiconductor material may have a lower or higher dielectric constant, in other embodiments.

One or more semiconductor devices may be formed in and/or above the semiconductor material of wafer 304. In addition, wafer 304 may include one or more layers of dielectric and conductive materials formed on top and/or bottom surfaces of the semiconductor material, including ground planes, power planes, and routing layers, to name a few. Electrically conductive vias may be formed through dielectric layers to provide electrical interconnection between conductive layers. According to an embodiment, wafer 304 includes one or more IC devices (e.g., IC device 306) that ultimately may be tested (e.g., for which electrical parameters may be determined) using testing system 300. IC device 306 may be, for example, an RF IC device (e.g., a monolithic microwave integrated circuit), although it is not necessarily so. As used herein, the term "wafer" means a substrate (e.g., silicon, silicon-on-insulator, gallium arsenide, and so on), devices formed within and/or above the substrate, conductive and dielectric layers formed on surfaces of the substrate, and vias formed through the dielectric layers.

In addition to IC device 306, wafer 304 may include one or more calibration standards (e.g., calibration standard 302) formed on a surface of wafer 304. Similar to the calibration standard 202 described in conjunction with FIG. 2, calibration standard 302 includes one or more thin-film, electrically conductive structures fabricated on a surface (e.g., a top surface) of wafer 304. Calibration standard 302 may be any one of a number of different types of calibration standards, and calibration standards in accordance with various embodiments include one or more conductive end structures. According to an embodiment, wafer 304 also may include an embedded ground structure to which portions of calibration standard 302 may be electrically connected. According to an embodiment, and as described in more detail in conjunction with FIG. 6, the embedded ground structure may include a ground plane positioned below the surface of wafer 304 on which calibration standard 302 is formed. Although only a single calibration standard 302 and IC device 306 are illustrated in FIG. 3, it is to be understood that multiple calibration standards of the same or different types and/or multiple IC devices of the same or different types may be fabricated in and on wafer 304.

Similar to the testing system 200 described in conjunction with FIG. 2, testing system 300 includes a VNA 308, cables 310, 312 connected to VNA ports 318, 320, and probes 314, 316. Using one or more on-wafer calibration standards (e.g., standard 302), a calibration procedure, such as that described in conjunction with FIG. 2, may be performed to determine electrical characteristics and/or an error model for testing system 300. IC 306 may subsequently be tested using testing system 300. For example, "on-wafer" testing may be performed in which probe needles connected to testing system 300 are brought into contact with conductive structures (e.g., pads 324) of IC 306. When IC 306 is tested in this manner, the electrical characteristics and/or error model for testing system 300 may be used to adjust electrical characteristic measurements generated during testing of IC 306 to effectively eliminate or de-embed the electrical characteristics of testing system 300. Because testing system 300 was calibrated using calibration standards (e.g., calibration standard 302) formed on the same wafer 304, the error model may be more accurate than it would be if testing system 300 was calibrated using calibration standards on a separate substrate. In addition, the potentially increased accuracy of the testing system error model due to calibration standard end structures implemented in accordance with various embodiments may enable more accurate measurements of the electrical characteristics of IC 306 to be obtained.

Figure 4:
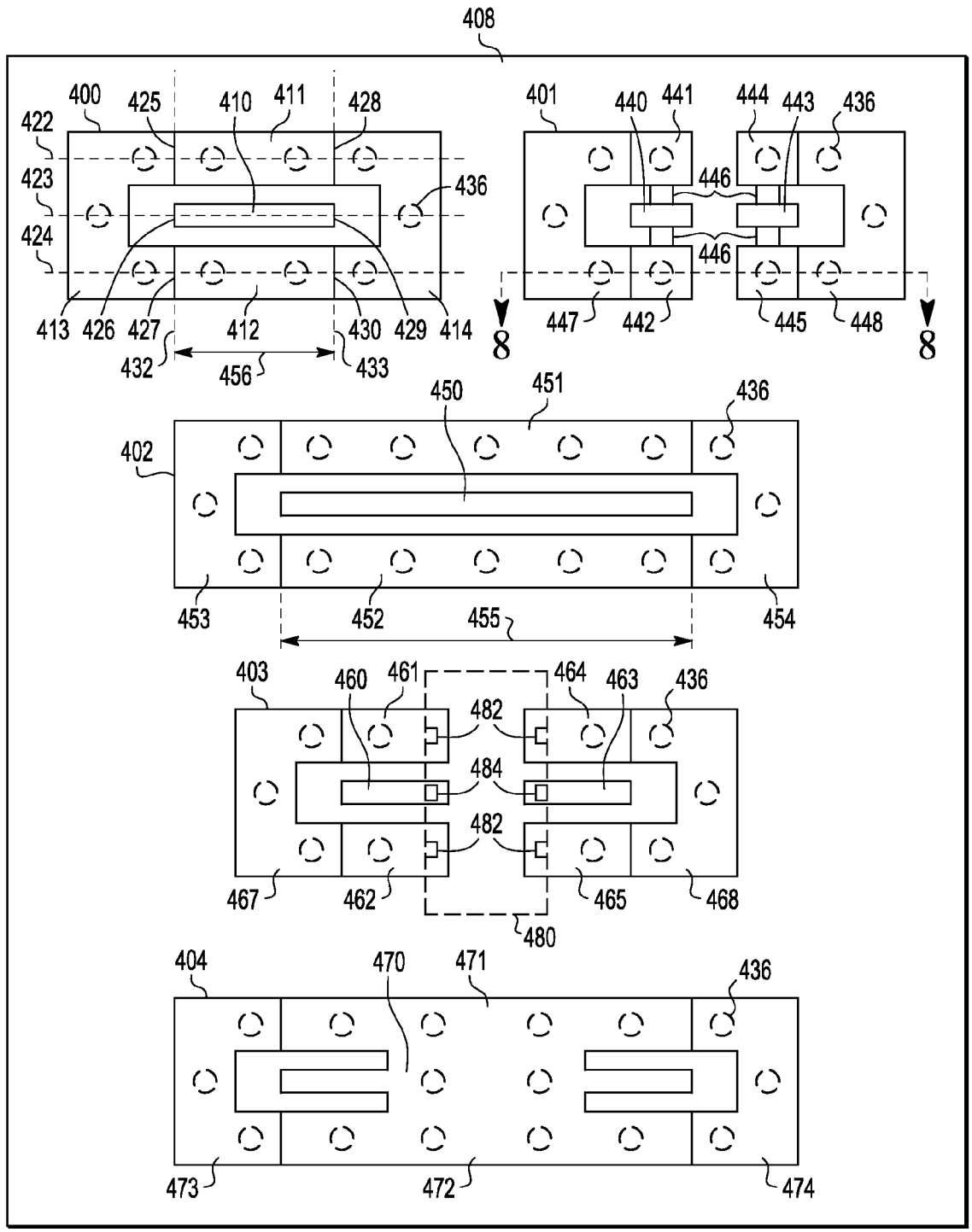
FIG. 4 illustrates a set of calibration standards fabricated on a substrate, according to an example embodiment.

FIG. 4 illustrates a set of calibration standards 400, 401, 402, 403, 404 fabricated on a substrate 408, according to an example embodiment. As used herein, the term "set" is defined to mean a group of one or more items. Accordingly, a "set of calibration standards" may refer to a single calibration standard or a plurality of calibration standards.

Substrate 408 may either be a wafer containing an IC to be tested (e.g., as in the embodiment depicted in FIG. 3) or a substrate that is separate from an IC to be tested (e.g., as in the embodiment depicted in FIG. 2), according to various embodiments. A calibration standard fabricated on a wafer that contains an IC to be tested may be referred to as an "on-wafer" calibration standard, and a calibration standard fabricated on a separate substrate from an IC to be tested may be referred to as an "off-wafer" calibration standard. It is to be understood that embodiments may include both on-wafer and off-wafer calibration standards.

Calibration standards 400-404 include patterns of thin conductive material (e.g., copper, gold, silver or other materials) fabricated (e.g., patterned or otherwise deposited) on a surface of substrate 408. FIG. 4 specifically illustrates a thru-type calibration standard 400, a load-type calibration standard 401, a line-type calibration standard 402, an open-type calibration standard 403, and a short-type calibration standard 404. It is to be understood that, in other embodiments, a set of calibration standards fabricated on a particular substrate may include only a single type of calibration standard, a different combination of calibration standard types than that illustrated in FIG. 4, and/or multiple instantiations of one or more of the various types of calibration standards. In addition, the arrangement of calibration standards on a particular substrate may be different from that illustrated in FIG. 4. Alignment marks (not illustrated) also may be printed or deposited on the surface of substrate 408 to assist in the placement of probe tips during testing.

Each of calibration standards 400-404 include at least one set of conductive structures fabricated on the surface of substrate 408 and at least one conductive end structure. For example, thru-type calibration standard 400 includes a set of conductive structures that includes an inner conductive structure 410, a first outer conductive structure 411 positioned to one side of the inner conductive structure 410, and a second outer conductive structure 412 positioned to an opposite side of the inner conductive structure 410. For the thru-type calibration standard 400, the inner conductive structure 410 is electrically isolated from the first and second outer conductive structures 411, 412.

Conductive structures 410-412 are aligned in parallel with each other along offset principal axes 422, 423, 424 of the conductive structures 410-412. According to an embodiment, the inner and outer conductive structures of each of the other calibration standards 401-404 depicted in FIG. 4 also are aligned in parallel, even though principal axes 422-424 are only depicted in conjunction with thru-type standard 400. Each conductive structure 410-412 includes a first end 425, 426, 427 and a second end 428, 429, 430. According to an embodiment, the first ends 425-427 are aligned along a secondary axis 432 that is perpendicular to the principal axes 422-424 of conductive structures 410-412, and the second ends 428-430 are aligned along another secondary axis 433 that is perpendicular to the principal axes 422-424 of conductive structures 410-412. According to an embodiment, the first and second ends of the conductive structures of each of the other calibration standards 401-404 depicted in FIG. 4 also are aligned along such secondary axes, even though secondary axes are only depicted in conjunction with thru-type standard 400.

Thru-type calibration standard 400 also includes first and second conductive end structures 413, 414. First conductive end structure 413 is electrically connected between the first end 425 of the first outer conductive structure 411 and the first end 427 of the second outer conductive structure 412. Similarly, second conductive end structure 414 is electrically connected between the second end 428 of the first outer conductive structure 411 and the second end 430 of the second outer conductive structure 412. The conductive end structures 413, 414 are electrically isolated and spatially separated from the first and second ends 426, 429 of the inner conductive structure 410 at the surface of the substrate, according to an embodiment.

As indicated by dashed circles depicted in conjunction with each of the calibration standards 400-404, one or more conductive vias 436 may be formed in the substrate 408 between any or all of outer conductive structures 411, 412 and/or end structures 413, 414 and a ground structure (e.g., ground plane 808, FIG. 8) embedded within substrate 408. Although FIG. 4 (and FIG. 7, described later) illustrates particular numbers and positions of vias 436 associated with each outer conductive structure and end structure, it is to be understood that the numbers and positions of vias 436 associated with each outer conductive structure and end structure may be different, in different embodiments.

According to an embodiment, the conductive end structures 413, 414 are integrally formed with the first and second outer conductive structures 411, 412 (e.g., from a same material and during a same process as the material and process used to form the first and second outer conductive structures 411, 412). According to other embodiments, the conductive end structures 413, 414 may not be integrally formed with the first and second outer conductive structures 411, 412 (e.g., the conductive end structures 413, 414 may be formed from a different material and/or during a different process as the material and process used to form the first and second outer conductive structures).

Line-type calibration standard 402 is similar to thru-type calibration standard 400, in that line-type calibration standard 402 includes a set of conductive structures and two end structures 453, 454 fabricated on the surface of substrate 408. However, line-type calibration standard 402 differs from thru-type calibration standard 400 in that the lengths 455 of the inner and outer conductive structures 450-452 of line-type calibration standard 402 may be significantly longer than the lengths 456 of the inner and outer conductive structures 410-412 of thru-type calibration standard 400. For example, if the length 456 of the inner and outer conductive structures 410-412 of thru-type calibration standard 400 is selected to be 500 µm, the length 455 of the inner and outer conductive structures 450-452 of line-type calibration standard 402 may be selected to be 900 µm to provide a specified delay (e.g., a delay of one forth of a wave length). As another example, if the length 456 of the inner and outer conductive structures 410-412 of thru-type calibration standard 400 is selected to be 1500 μm, the length 455 of the inner and outer conductive structures 450-452 of line-type calibration standard 402 may be selected to be 1900 μm.

More particularly, line-type calibration standard 402 includes a set of conductive structures that includes an inner conductive structure 450, a first outer conductive structure 451 positioned to one side of the inner conductive structure 450, and a second outer conductive structure 452 positioned to an opposite side of the inner conductive structure 450, where the inner conductive structure 450 is electrically isolated from the first and second outer conductive structures 451, 452. In addition, line-type calibration standard 402 includes first and second conductive end structures 453, 454, which may be integrally or separately formed with the inner and outer conductive structures 450-452. According to an embodiment, the lengths 455 of the inner and outer conductive structures 450-452 are sufficient to simulate a transmission line.

Open-type calibration standard 403 includes two sets of conductive structures and two conductive end structures 467, 468 fabricated on the surface of substrate 408. More particularly, open-type calibration standard 403 includes a first set of conductive structures that includes a first inner conductive structure 460, a first outer conductive structure 461 positioned to one side of the first inner conductive structure 460, and a second outer conductive structure 462 positioned to an opposite side of the first inner conductive structure 460. In addition, open-type calibration standard 403 includes a second set of conductive structures that includes a second inner conductive structure 463, a third outer conductive structure 464 positioned to one side of the second inner conductive structure 463, and a fourth outer conductive structure 465 positioned to an opposite side of the second inner conductive structure 463. For the open-type calibration standard 403, the first inner conductive structure 460 is electrically isolated from the first and second outer conductive structures 461, 462, and the second inner conductive structure 463 is electrically isolated from the third and fourth outer conductive structures 464, 465. In addition, the first set of conductive structures (i.e., conductive structures 460-462) is spatially separated from the second set of conductive structures (i.e., conductive structures 463-465) at the surface of the substrate 408.

As mentioned above, open-type calibration standard 403 also includes first and second conductive end structures 467, 468. First conductive end structure 467 is electrically connected between a first end of the first outer conductive structure 461 and a first end of the second outer conductive structure 462. Similarly, second conductive end structure 464 is electrically connected between a second end of the first outer conductive structure 461 and a second end of the second outer conductive structure 462. Conductive end structure 463 is electrically isolated and spatially separated from the first inner conductive structure 460 at the surface of the substrate 408, and conductive end structure 464 is electrically isolated and spatially separated from the second inner conductive structure 461 at the surface of the substrate 408, according to an embodiment. Open-type calibration standard 403 may be used to perform an open measurement in conjunction with a calibration procedure.

Load-type calibration standard 401 is similar to open-type calibration standard 403, in that load-type calibration standard 401 also includes first and second sets of conductive structures and two end structures 447, 448 fabricated on the surface of substrate 408. However, load-type calibration standard 401 differs from open-type calibration standard 403 in that load-type calibration standard 401 also includes resistive loads 446 electrically connected between adjacent conductive structures. According to an embodiment, resistive loads 446 are precisely formed to have a known and desired value for each port (e.g., 50 ohms or some other value).

More particularly, load-type calibration standard 401 includes a first set of conductive structures that includes a first inner conductive structure 440, a first outer conductive structure 441 positioned to one side of the first inner conductive structure 440, and a second outer conductive structure 442 positioned to an opposite side of the first inner conductive structure 440. In addition, load-type calibration standard 401 includes a second set of conductive structures that includes a second inner conductive structure 443, a third outer conductive structure 444 positioned to one side of the second inner conductive structure 443, and a fourth outer conductive structure 445 positioned to an opposite side of the second inner conductive structure 443. A resistive load 446 is electrically connected between each inner conductive structure 440, 443 and the outer conductive structures 441, 442, 444, 445 to either side.

Load-type calibration standard 401 also includes first and second conductive end structures 447, 448. First conductive end structure 447 is electrically connected between a first end of the first outer conductive structure 441 and a first end of the second outer conductive structure 442. Similarly, second conductive end structure 444 is electrically connected between a second end of the first outer conductive structure 441 and a second end of the second outer conductive structure 442. Conductive end structure 447 is electrically isolated and spatially separated from the first inner conductive structure 440 at the surface of the substrate 408, and conductive end structure 448 is electrically isolated and spatially separated from the second inner conductive structure 441 at the surface of the substrate 408, according to an embodiment.

Short-type calibration standard 404 also is similar to thru-type calibration standard 400, in that short-type calibration standard 404 includes a set of conductive structures and two end structures 473, 474 fabricated on the surface of substrate 408. However, short-type calibration standard 404 differs from thru-type calibration standard 400 in that the conductive structures in the set of conductive structures are electrically connected. More particularly, short-type calibration standard 404 includes a set of conductive structures that includes an inner conductive structure 470, a first outer conductive structure 471 positioned to one side of the inner conductive structure 470, and a second outer conductive structure 472 positioned to an opposite side of the inner conductive structure 470. The inner conductive structure 470 and the first and second outer conductive structures 471, 472 are electrically connected between the ends of the inner conductive structure and the first and second conductive end structures. In addition, short-type calibration standard 404 includes first and second conductive end structures 473, 474, which may be integrally or separately formed with the inner and outer conductive structures 470-472.

During a calibration procedure (e.g., a calibration procedure such as that discussed in conjunction with FIG. 10, later) or during testing of a device, conductive pads of the device may sequentially be brought into contact with the conductive structures of multiple calibration standards 400-404. To illustrate, for example, an outline of a device 480 having conductive pads 482, 484 is shown in conjunction with open-type calibration standard 403. More particularly, ground contact pads 482 of a device may be brought into contact with the outer conductive structures (e.g., structures 461, 462, 464, 465) of a calibration standard, and signal pads 484 of a device may be brought into contact with the inner conductive structure(s) (e.g., structures 460, 463) of a calibration standard. Probes (e.g., probes 214, 216 or 314, 316, FIG. 2 or 3) of a testing system may then be brought into contact with probe contact areas of the inner and outer conductive structures, and the testing system may provide excitation signals to the device and measure responsive signals via the probes. When correlated with probe tips of a GSG probe (e.g., probe tips 524 of probe 526, FIG. 5), the inner conductive structures (e.g., structures 410, 440, 443, 450, 460, 463, 470) may correspond with the signal bearing tip of the probe (e.g., a central or "S" probe tip), and the first and second outer conductive structures (e.g., structures 411, 412, 441, 442, 444, 445, 451, 452, 461, 462, 464, 465, 471, 472) may correspond with the ground tips of the probe (e.g., the outer or "G" probe tips).

Figure 5:
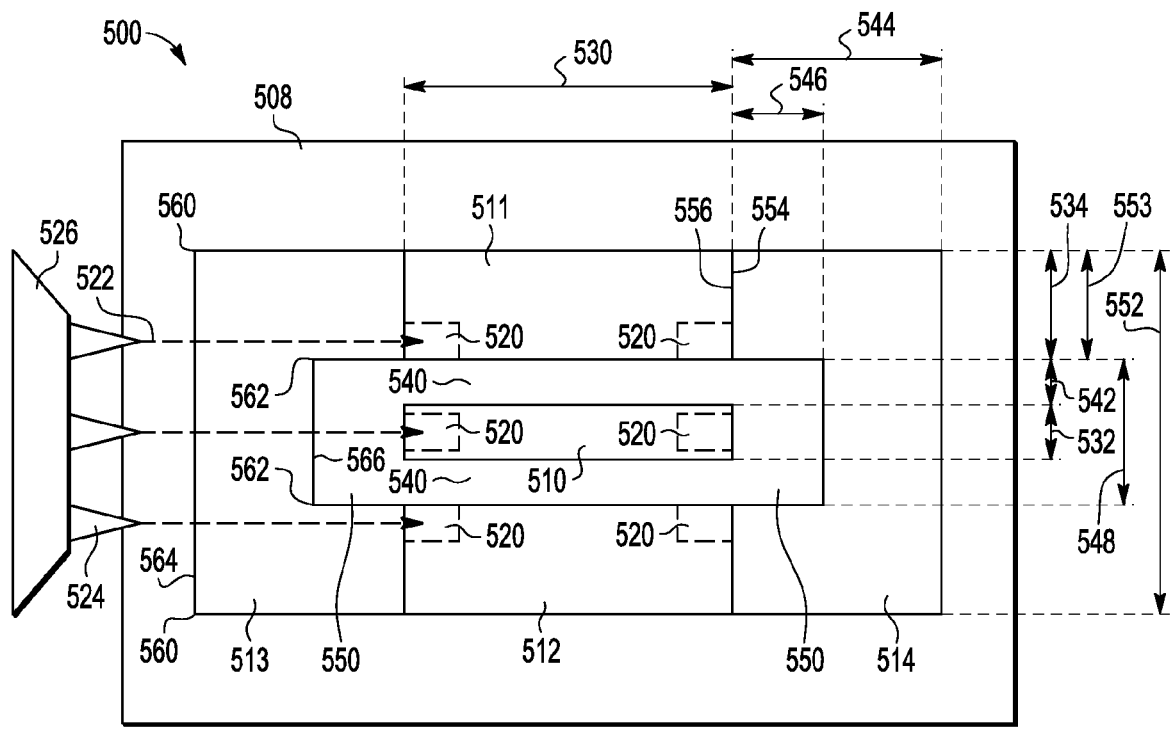
FIG. 5 illustrates a thru-type calibration standard, according to an example embodiment.

A more detailed description of an embodiment of a calibration standard having conductive end structures is provided in conjunction with FIG. 5, which illustrates a thru-type calibration standard 500 (e.g., thru-type calibration standard 400, FIG. 4), according to an example embodiment. Thru-type calibration standard 500 includes a set of conductive structures that includes an inner conductive structure 510, a first outer conductive structure 511 positioned to one side of the inner conductive structure 510, a second outer conductive structure 512 positioned to an opposite side of the inner conductive structure 510, and first and second conductive end structures 513, 514 fabricated on a surface of a substrate 508. The inner and outer conductive structures 510-512 may have probe contact areas 520 proximate to first and second ends of the inner and outer conductive structures 510-512. As indicated by arrows 522, probe tips 524 of a probe 526 may be brought into contact with probe contact areas 520 during a calibration procedure or during testing of a device. Although only one probe 526 is shown, it is to be understood that calibration or device testing may involve contacting two probes to the same or different probe contact areas. According to an embodiment, the probe pitch (e.g., distance between adjacent probe tips 524) and thus the center-to-center distance between probe contact areas 520 may be in a range of about 100-750 μm, although the probe pitch and distance between probe contact areas 520 may be smaller or larger, in other embodiments.

The relative dimensions of the various conductive structures, according to an embodiment, will now be discussed. Example dimensions also are provided, below, although the example dimensions are not intended to be limiting. According to an embodiment, the distance 530 between conductive end structures 513, 514 may be in a range of about 300 μm to about 1500 μm, although the distance may be shorter or longer, in other embodiments. For a thru-type calibration standard (e.g., standard 500) and a short-type calibration standard (e.g., standard 404, FIG. 4), the distance between conductive end structures may be equal to the lengths of the inner and outer conductive structures. For load-type or open-type calibration standards (e.g., standards 401, 403, FIG. 4), the distance between conductive end structures may be equal to the lengths of both sets of inner and outer conductive structures plus the spatial separation between the sets of inner and outer conductive structures. For example, the length of each set of inner and outer conductive structures for load-type or open-type calibration standards may be in a range of about 300 μm to about 1500 μm, although the lengths may be shorter or longer, in other embodiments. For a line-type calibration standard (e.g., calibration standard 402, FIG. 4), the distance between conductive end structures and the lengths of the inner and outer conductive structures typically is about one fourth wavelength greater than the distance/lengths associated with thru-type calibration standards, although the distance may be shorter or longer, in other embodiments.

The half width 532 of inner conductive structure 510 plus width 542 of gap 540 should be narrower than the probe pitch for the probes with which the standard 500 is to be used. For example, inner conductive structure 510 may have a width 532 in a range of about 50 μm to about 1000 μm (e.g., for probes having pitches in a range of about 100-1500 μm, for example), although width 532 may be narrower or wider, in other embodiments. Outer conductive structures 510-512 may have widths 534 in a range of about 100 μm to about 1000 μm, although the widths 534 may be narrower or wider, in other embodiments. According to an embodiment, the width 532 of the inner conductive structure 510 may be significantly narrower than the widths 534 of the outer conductive structures 511, 512. For example, the width 532 of the inner conductive structure 510 may be in a range of about 10-90 percent of the widths 534 of the outer conductive structures. In alternate embodiments, the widths 532, 534 of the inner and outer conductive structures may be substantially equal, or the width 532 of the inner conductive structure 510 may be significantly wider than the widths 534 of the outer conductive structures. According to an embodiment, the inner and outer conductive structures 510-512 are spatially separated, at the surface of substrate 508, by gaps 540 having widths 542 in a range of about 20 μm to about 150 μm, although gaps 540 may be narrower or wider, in other embodiments.

Conductive end structures 513, 514 are roughly rectangular conductive material structures, except that conductive material is excluded in areas 550 that are adjacent to ends of inner conductive structure 510. According to an embodiment, the width 552 of each conductive end structure 513, 514 is substantially equal to the combined widths 532, 534 of the inner and outer conductive structures 510-512 and the widths 542 of the intervening gaps 540. In other embodiments, the width 552 of a conductive end structure 513, 514 may be narrower or wider than the combined widths 534, 534, 542 of the conductive structures 510-512 and gaps 540. According to a particular embodiment, the conductive end structures 513, 514 have widths 552 in a range of about 400 μm to about 1000 μm, although the widths 552 may be narrower or wider, in other embodiments. In addition, the length 554 of each conductive end structure is in a range of about 80 μm to about 500 μm, although the length 544 may be narrower or wider, in other embodiments.

The area 550 in which material is excluded in a conductive end structure 513, 514 may have a length 546 in a range of about one fourth of the wavelength, according to an embodiment. For example, the length 546 of area 550 may be in a range of about 300 μm to about 500 μm, although the length 546 may be narrower or wider, in other embodiments.

According to an embodiment, the width 548 of area 550 substantially equals the combined widths 532 of the inner conductive structure 510 and the widths 542 of the gaps 540 intervening between the inner and outer conductive structures 510-512. For example, the width 548 of area 550 may be in a range of about 70 μm to about 1200 μm, although the width 548 may be narrower or wider, in other embodiments. In the embodiment depicted in FIG. 5, a width 553 of an end (e.g., end 554) of a conductive end structure 513, 514 is substantially equal to the width 534 of an outer conductive structure (e.g., outer conductive structure 511) to which the end abuts. For example, width 553 may be in a range of about 100 μm to about 1000 μm, although width 553 may be narrower or wider, in other embodiments. In an alternate embodiment, a width of an end of a conductive end structure may be narrower than the width of an outer conductive structure to which the end abuts, as is depicted in FIG. 6.

Figure 6:
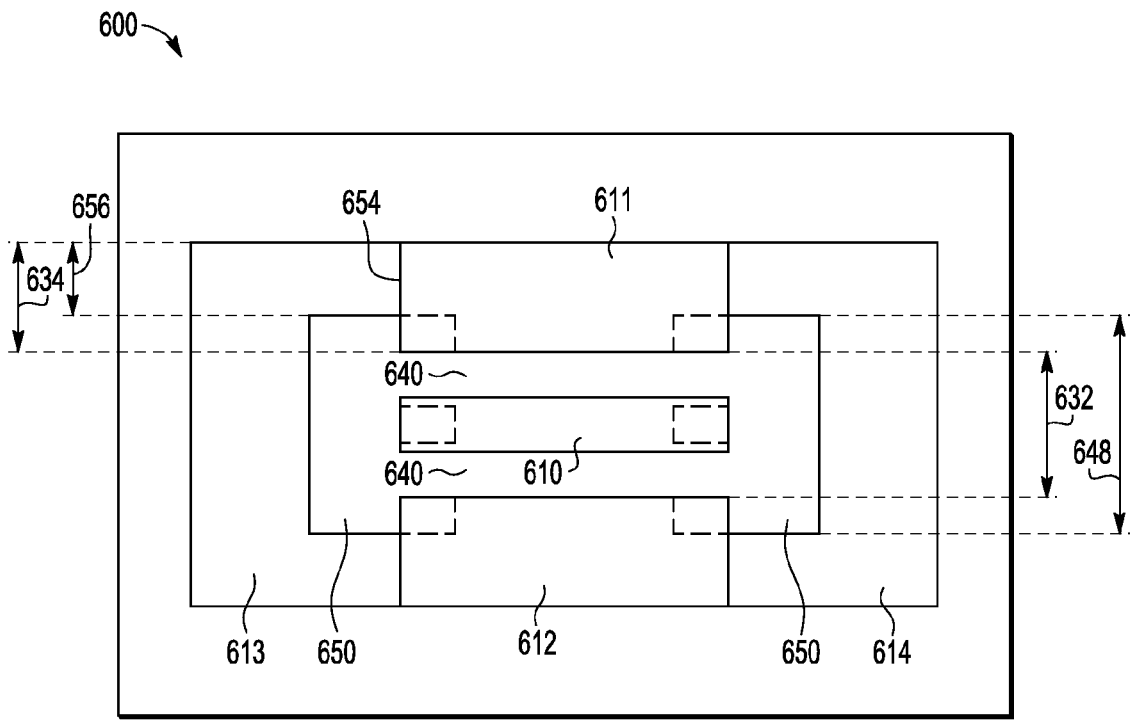
FIG. 6 illustrates a thru-type calibration standard, according to an alternate embodiment.

More particularly, FIG. 6 illustrates a thru-type calibration standard 600, according to an alternate embodiment. Similar to the conductive end structures 513, 514 depicted in FIG. 5, conductive end structures 613, 614 are roughly rectangular conductive material structures, and conductive material is excluded in areas 650 that are adjacent to ends of inner conductive structure 610. In contrast to the conductive end structures 513, 514 of FIG. 5, however, the width 648 of area 650 is substantially greater than the combined widths 632 of the inner conductive structure 610 and the gaps 640 intervening between the inner and outer conductive structures 610, 611, 612. In a particular embodiment, width 648 is in a range of 105-150 percent of the combined widths 632 of the inner conductive structure 610 and gaps 640. For example, the width 648 of area 650 may be in a range of about 100 μm to about 1500 μm, although width 648 may be narrower or wider, in other embodiments. In the embodiment depicted in FIG. 6, a width 656 of an end (e.g., end 654) of a conductive end structure 613, 614 is substantially less than the width 634 of an outer conductive structure (e.g., outer conductive structure 611) to which the end abuts. In a particular embodiment, width 656 is in a range of 50-80 percent of the width 634 an outer conductive structure 611, 612. For example, the width 656 may be in a range of about 80 μm to about 300 μm, although the width 656 may be narrower or wider, in other embodiments.

Figure 7:
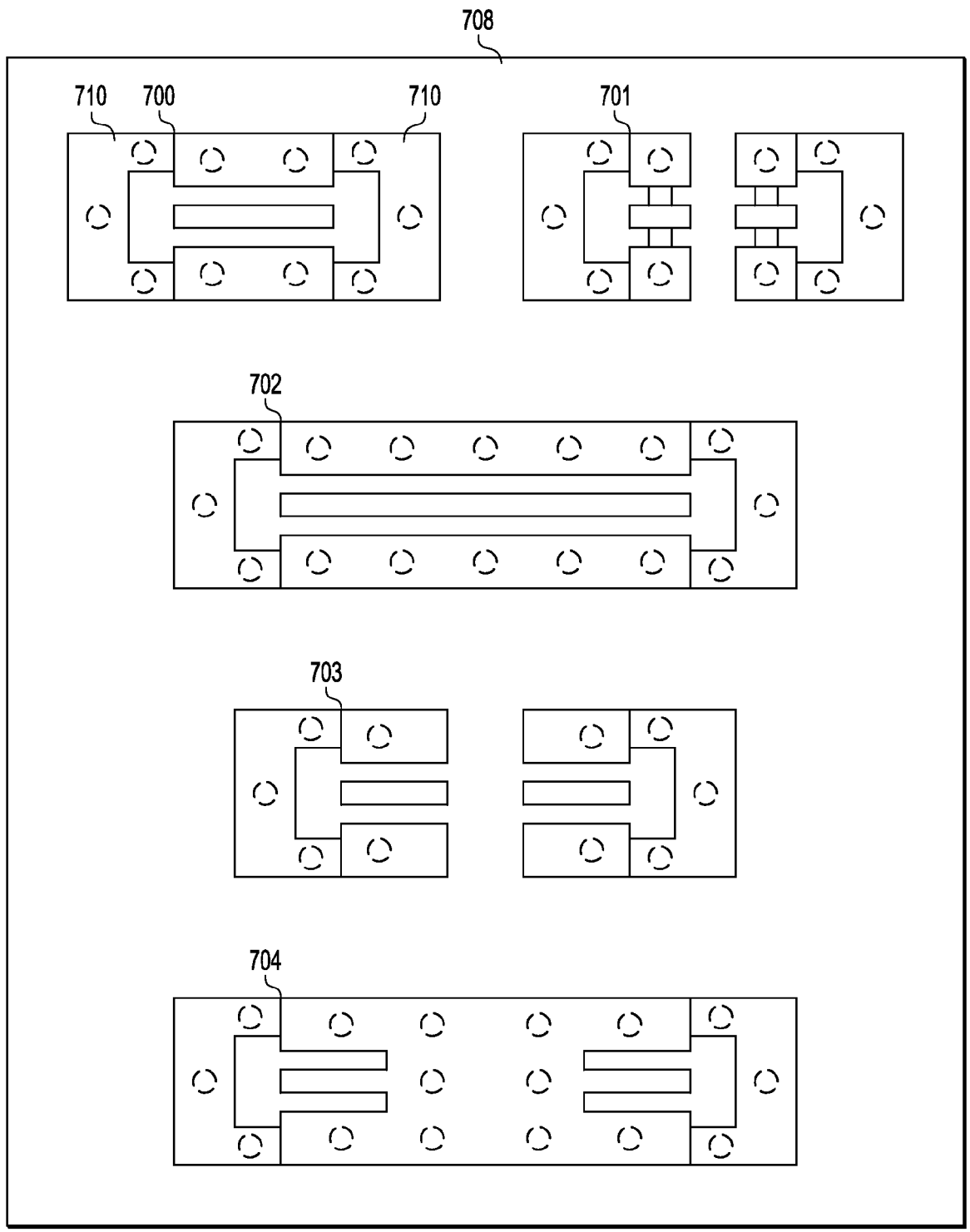
FIG. 7 illustrates a set of calibration standards fabricated on a substrate, according to an alternate embodiment.

FIG. 7 illustrates a set of calibration standards 700, 701, 702, 703, 704 fabricated on a substrate 708, according to an alternate embodiment. The calibration standards 700-704 of FIG. 7 are similar to the calibration standards 400-404 of FIG. 4, except that the calibration standards 700-704 of FIG. 7 include conductive end structures (e.g., conductive end structures 710) having a configuration such as those depicted in FIG. 6. More particularly, calibration standards 700-704 include conductive end structures 710 in which the width (e.g., width 656, FIG. 6) of an end of a conductive end structure 710 is substantially less than the width (e.g., width 634, FIG. 6) of an outer conductive structure to which the end abuts.

Although FIGS. 4-7 depict conductive end structures having substantially rectangular shapes, other embodiments may include conductive end structures having other shapes. For example, other embodiments include conductive end structures having rounded outer corners (e.g., corners 560, FIG. 5) and/or rounded inner corners (e.g., corners 562, FIG. 5). This may yield conductive end structures having a semicircular or arced outer perimeter (e.g., outer perimeter 564) and/or a semicircular or arced inner perimeter (e.g., inner perimeter 566 of area 550). In still other embodiments, the conductive end structures may have shapes other than those previously described.

Figure 8:
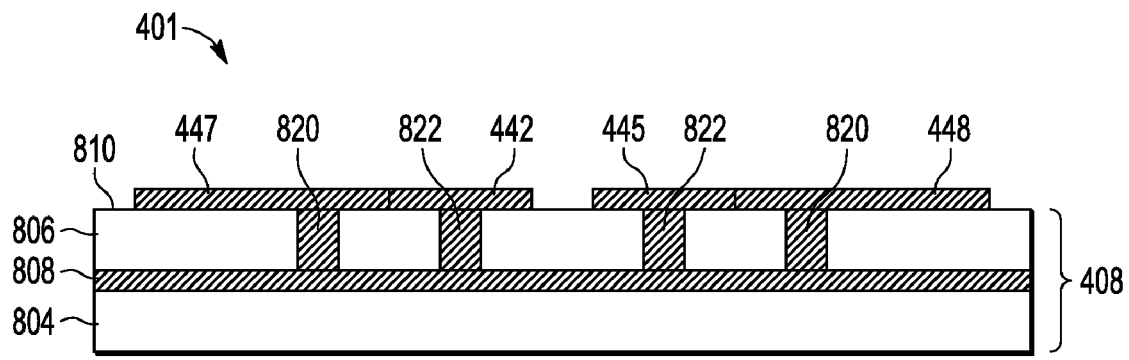
FIG. 8 illustrates a cross-sectional view of a calibration standard and the substrate of FIG. 4 along line 8-8, according to an example embodiment.

As mentioned previously, one or more conductive vias (e.g., vias 436, FIG. 4) may be formed in a substrate between a ground structure and any or all of the outer conductive structures and/or end structures of a calibration standard. For example, FIG. 8 illustrates a cross-sectional view of calibration standard 401 and the substrate 408 of FIG. 4 along line 8-8, according to an example embodiment. Substrate 408 may have a thickness in a range of about 50 to 1000 micrometers, according to an embodiment, although substrate 408 may be narrower or wider, in other embodiments. Substrate 408 may include one or more dielectric and/or semiconductor material layers 804, 806 and one or more embedded ground structures or ground planes 808.

Calibration standards, such as calibration standard 401, may be formed on a surface 810 of substrate 408, as described earlier. Calibration standard 401 specifically includes two sets of conductive structures, with outer conductive structures 442, 445 shown in cross section, although other types of calibration standards may be differently configured. In addition, calibration standard 401 includes conductive end structures 447, 448. Calibration standard 401 is formed of a conductive material having a thickness in a range of about 2 μm to about 10 μm, in an embodiment, although the conductive material may be thicker or thinner, in other embodiments.

One or more conductive vias 820 may be formed in substrate 408 between the substrate surface 810 and the embedded ground structure 808. According to an embodiment, vias 820 may be formed in locations that correspond to the locations of some or all of the conductive structures from which a calibration standard is formed. For example, as illustrated in FIG. 8, one or more vias 820 may be formed in substrate 408 between each of the conductive end structures 447, 448 and the embedded ground structure 808, and/or one or more vias 822 may be formed in substrate 408 between outer conductive structures (e.g., outer conductive structures 441, 442, 444, 445) and the embedded ground structure 808, according to various embodiments. Although FIG. 8 depicts particular numbers and positions of vias 820, 822 in conjunction with a particular type of calibration standard 401, it is to be understood that other embodiments may include more or fewer vias 820, 822 and/or vias used in conjunction with other types of calibration standards.

Figure 9:
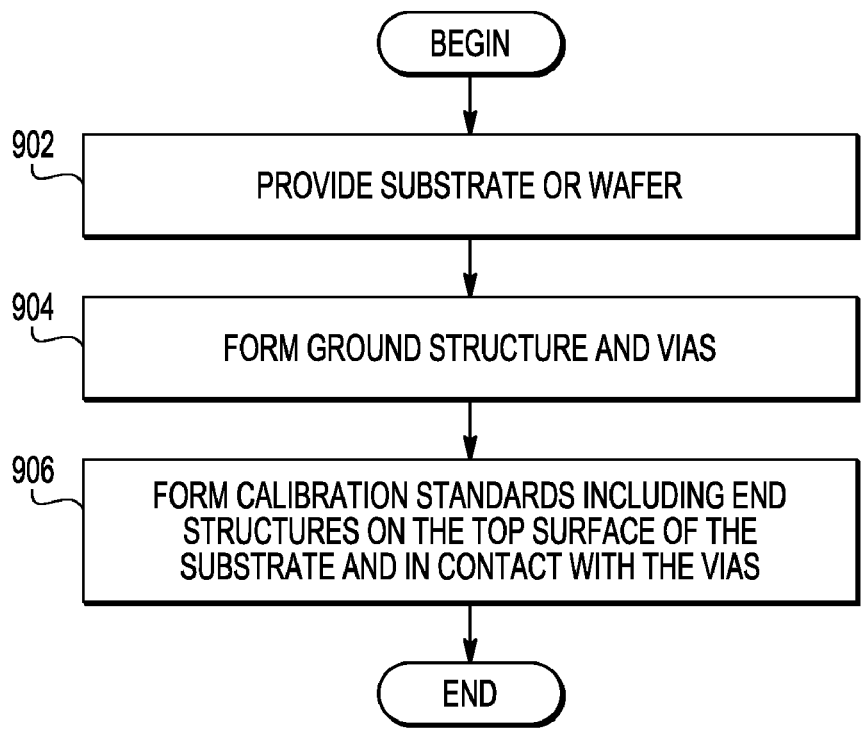
FIG. 9 illustrates a flowchart of a method for fabricating a set of calibration standards on a substrate, according to an example embodiment.

FIG. 9 illustrates a flowchart of a method for fabricating a set of calibration standards on a substrate, according to an example embodiment. The method may begin, in block 902, by providing a wafer or substrate (e.g., substrate 408, FIG. 4). According to various embodiments, the substrate may be a printed circuit board, a semiconductor wafer or another type of rigid or semi-rigid structure conducive to providing structural support for a calibration standard. For example, the substrate may be a semiconductor wafer upon which a device may be fabricated and tested (e.g., a device whose electrical parameters are to be tested by a testing system). Alternatively, the substrate may be a substrate that is separate from a device to be tested. According to an embodiment, the substrate may include an embedded ground structure (e.g., ground plane 808, FIG. 8) or a conductive (e.g., metal) ground to be fabricated.

In block 904, a conductive ground plane or structure and conductive vias (e.g., vias 820, 822, FIG. 8) may be formed on the substrate. According to an embodiment, the conductive vias may be formed between a surface of the substrate on which calibration standards are to be formed (e.g., a top surface) and a previously formed, embedded ground structure or a ground structure to be fabricated in a later fabrication step. The vias may be formed using conventional techniques, which may include, for example, forming openings between the top surface and the location of the ground structure, and filling the openings with conductive material. According to an embodiment, the vias are formed in locations that correspond to some or all of a calibration standard's outer conductive structures (e.g., outer conductive structures 411, 412, FIG. 4) and/or conductive end structures (e.g., conductive end structures 413, 414, FIG. 4).

In block 906, one or more calibration standards that include one or more conductive end structures are formed on the top surface of the substrate over and in contact with the vias. The calibration standards may be formed using conventional techniques for forming patterned conductive material, including, for example, various additive or subtractive material deposition techniques. As discussed in detail above, calibrations standards of various embodiments may be formed to include one or more inner conductive structures, two or more outer conductive structures, and one or more conductive end structures electrically connected to the outer conductive structures. In an embodiment, the conductive end structures are integrally formed with the outer conductive structures (e.g., using the same materials and during the same processing steps). In other embodiments, the conductive end structures may be formed from different materials and/or during different processing steps from the materials and/or processing steps used to form the outer conductive structures. The various calibration standards formed may include, for example, thru-type, load-type, line-type, open-type, and short-type calibration standards configured as shown in FIGS. 4 and 7. In other embodiments, calibration standards having conductive end structures that are configured differently from the examples shown in FIGS. 4 and 7 may be formed. The method may then end.

Figure 10:
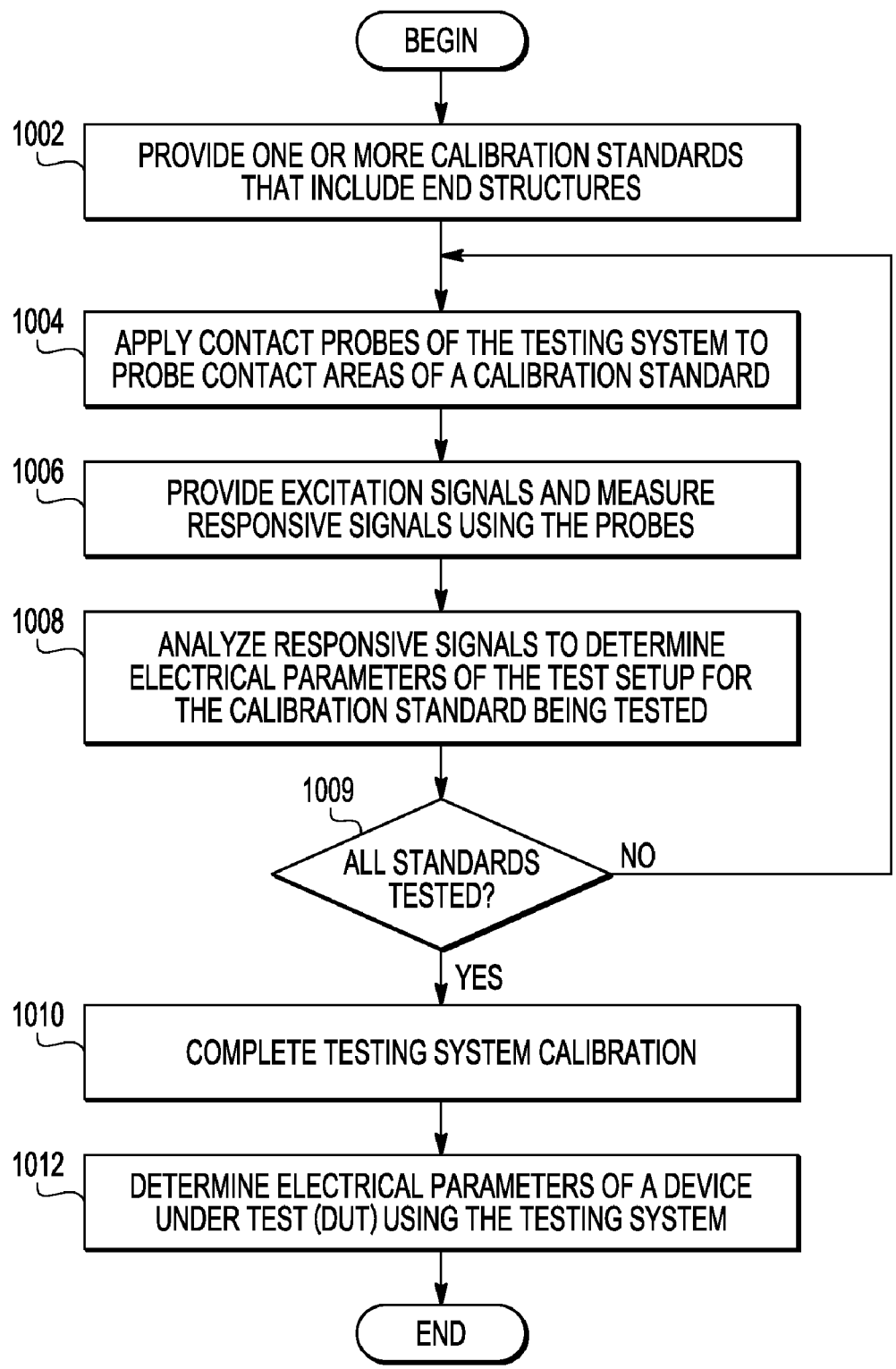
FIG. 10 illustrates a flowchart of a method for determining electrical parameters of a testing system and an integrated circuit device using a set of calibration standards, according to an example embodiment.

FIG. 10 illustrates a flowchart of a method for determining electrical parameters of a testing system and an integrated circuit device using a set of calibration standards, according to an example embodiment. Prior to determining the electrical parameters of a device having unknown electrical parameters, a calibration procedure of the testing system (e.g., testing system 200, 300, FIGS. 2, 3) may first be performed, as described previously. Calibration of the testing system may include performance of a one-tier or a two-tier calibration procedure, according to various embodiments. Using a two-tier calibration procedure, a first calibration process (e.g., a "cable calibration") may be performed using a cable connection, resulting in a first error model that indicates the errors introduced by the VNA and the cables. A second calibration process (e.g., a "probe-tip calibration") may then be performed using probes, resulting in a second error model that indicates the errors introduced by the probes. Alternatively, a one-tier calibration procedure may be performed using a single calibration process in which an error model is generated that reflects the errors introduced by the VNA, cables, and probes. Blocks 1002-1010 depict an embodiment of a testing system calibration procedure, and block 1012 depicts an embodiment of a device parameter testing procedure. It is to be understood that calibration standards, in accordance with various embodiments previously described, may be used in conjunction with testing system calibration procedures other than those described herein, and accordingly the various descriptions of such calibration procedures are intended for example purposes, and not for the purpose of limitation.

The method may begin, in block 1002, by providing one or more calibration standards (e.g., calibration standards 400-404, 700-704, FIGS. 4, 7) that include end structures, in accordance with various embodiments previously described. As discussed, the calibration standards may be fabricated on the same substrate as an electrical device ultimately to be tested, or the calibration standards may be fabricated on a separate substrate from an electrical device ultimately to be tested.

In block 1004, the probe tips of probes (e.g., probes 214, 216, 314, 316, FIGS. 2, 3) are applied to (i.e., brought into contact with) the calibration standard (e.g., with probe contact areas 520, FIG. 5 of the calibration standard). In block 1006, excitation signals are provided by the testing system (e.g., by a VNA of the testing system) through one of the probes, and responsive signals are measured by the testing system through both probes. In block 1008, the responsive signals are analyzed to determine an electrical characteristic (e.g., an S-parameter) of the test setup. The determined electrical characteristic includes a characteristic of the testing system (e.g., VNA, cables, and probes). The responsive signals may include, for example, measurements of the amplitudes of forward and/or reverse waves traveling to/from the calibration standard's ports. Blocks 1006 and 1008 may be performed manually (e.g., through input of commands manually by an operator of the testing system), or blocks 1006-1008 may be performed automatically by the testing system. Either way, blocks 1004-1008 may be repeated one or more additional times to determine one or more additional electrical parameters (e.g., additional S-parameters using the same calibration standard). In block 1009, a determination is made whether all calibration standards have been tested. If not, the process iterates as shown. If so, the process proceeds to block 1010.

In block 1010, calibration of the testing system is completed by generating an error model of the testing system (e.g., by a processing system associated with the VNA or a separate computer) using the electrical parameters determined in blocks 1004-1009. The error model approximates the testing system's non-idealities. According to an embodiment, the error model may be based upon the use of S-parameter representations of network properties, for example, although the error model may be based on other representations, as well. The non-idealities represented in the error model may then be factored into future analyses performed by the testing system, to ensure that characteristics of a DUT with unknown characteristics are accurately measured. Various types of calibration procedures may be performed in conjunction with blocks 1004-1010. For example, according to an embodiment, a Thru-Reflect-Line (TRL) calibration procedure may be performed, which may use thru, line, and open standards (e.g., standards 400, 402, 403 or 700, 702, 703, FIGS. 4, 7).

In block 1012, electrical parameters of a DUT are then determined using the "calibrated" testing system. According to an embodiment, this may include contacting the probe tips to test pads of the DUT, providing excitation signals, and measuring responsive signals (e.g., using the VNA). Because the electrical parameters of the DUT are measured with the calibrated testing system, the DUT's live electrical parameters can be accurately determined. The electrical parameters determined using the various embodiments may thereafter be evaluated for any of several purposes. For example, when testing is performed in the context of a device design effort, the measured electrical parameters may be used to validate a proposed design or to indicate device design changes that may result in improved or otherwise modified characteristic electrical parameters of a device. When a determination is made that the measured electrical parameters of a DUT having a candidate device design compare unfavorably to device specifications (e.g., specifications relating to the S-parameters of a device), for example, device designers may alter the device design in an attempt to produce a device design for which measured electrical parameters compare favorably to the device specifications. Alternatively, when testing is performed in the context of a device manufacturing and testing process, the measured electrical parameters may be used as a basis for accepting or rejecting devices produced by a manufacturing line. When a determination is made that the measured electrical parameters of a DUT compare unfavorably to device specifications, for example, the DUT may be rejected (e.g., not shipped to customers and/or discarded). The procedure may then end.

Thus, various embodiments of calibration standards and methods for their fabrication and use have been described above. An embodiment includes a set of calibration standards comprising a substrate having a surface, a first set of first conductive structures fabricated on the surface of the substrate, and a first conductive end structure. The first conductive structures include a first inner conductive structure, a first outer conductive structure positioned to one side of the first inner conductive structure, and a second outer conductive structure positioned to an opposite side of the first inner conductive structure. The first conductive structures are aligned in parallel with each other along offset principal axes of the first conductive structures. The first conductive end structure is electrically connected between a first end of the first outer conductive structure and a first end of the second outer conductive structure, and the first conductive end structure is spatially separated from a first end of the first inner conductive structure at the surface of the substrate.

Another embodiment includes a method for fabricating a set of calibration standards. The method comprises the steps of providing a substrate having a surface, forming a first set of first conductive structures on the surface of the substrate, and forming a first conductive end structure on the surface of the substrate. The first conductive structures include a first inner conductive structure, a first outer conductive structure positioned to one side of the first inner conductive structure, and a second outer conductive structure positioned to an opposite side of the first inner conductive structure. The first conductive structures are aligned in parallel with each other along offset principal axes of the first conductive structures. The first conductive end structure is electrically connected between a first end of the first outer conductive structure and a first end of the second outer conductive structure, and the first conductive end structure is spatially separated from a first end of the first inner conductive structure at the surface of the substrate.

Yet another embodiment includes a method for using a set of calibration standards with a testing system configured to test electrical characteristics of an integrated circuit device. The method comprises the steps of providing a set of calibration standards, contacting probes of the testing system with probe contact areas of the calibration standards, providing excitation signals through the probes, measuring responsive signals through the probes, and analyzing the responsive signals to determine electrical characteristics of the testing system. The set of calibration standards includes a substrate having a surface, a first set of first conductive structures fabricated on the surface of the substrate, and a first conductive end structure. The first conductive structures include a first inner conductive structure, a first outer conductive structure positioned to one side of the first inner conductive structure, and a second outer conductive structure positioned to an opposite side of the first inner conductive structure. The first conductive structures are aligned in parallel with each other along offset principal axes of the first conductive structures. The first conductive end structure is electrically connected between a first end of the first outer conductive structure and a first end of the second outer conductive structure, and the first conductive end structure is spatially separated from a first end of the first inner conductive structure at the surface of the substrate.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments described herein are, for example, capable of operation or fabrication in sequences or arrangements other than those illustrated or otherwise described herein. In addition, the sequence of processes, blocks or steps depicted in and described in conjunction with any flowchart is for example purposes only, and it is to be understood that various processes, blocks or steps may be performed in other sequences and/or in parallel, in other embodiments, and/or that certain ones of the processes, blocks or steps may be combined, deleted or broken into multiple processes, blocks or steps, and/or that additional or different processes, blocks or steps may be performed in conjunction with the embodiments. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter. The various functions or processing blocks discussed herein and illustrated in the Figures may be implemented in hardware, firmware, software or any combination thereof. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A set of calibration standards comprising:
    a substrate having a surface;
    a first set of first conductive structures fabricated on the surface of the substrate, wherein the first conductive structures include a first inner conductive structure, a first outer conductive structure positioned to one side of the first inner conductive structure, and a second outer conductive structure positioned to an opposite side of the first inner conductive structure, and wherein the first conductive structures are aligned in parallel with each other along offset principal axes of the first conductive structures; and
    a first conductive end structure electrically connected between a first end of the first outer conductive structure and a first end of the second outer conductive structure, wherein the first conductive end structure is spatially separated from a first end of the first inner conductive structure at the surface of the substrate.

2. The set of calibration standards of claim 1, wherein the set of calibration standards further comprise:
    a second conductive end structure electrically connected between a second end of the first outer conductive structure and a second end of the second outer conductive structure, wherein the second conductive end structure is spatially separated from a second end of the first inner conductive structure at the surface of the substrate, and wherein the first inner conductive structure is electrically isolated from the first and second conductive end structures.

3. The set of calibration standards of claim 2, wherein the first set of first conductive structures, the first conductive end structure, and the second conductive end structure form portions of a thru-type calibration standard.

4. The set of calibration standards of claim 2, wherein the first set of first conductive structures, the first conductive end structure, and the second conductive end structure form portions of a line-type calibration standard.

5. The set of calibration standards of claim 1, further comprising:
a second conductive end structure electrically connected between a second end of the first outer conductive structure and a second end of the second outer conductive structure, wherein the second conductive end structure is spatially separated from a second end of the first inner conductive structure at the surface of the substrate, and
wherein the first set of first conductive structures are electrically connected between the first ends and the second ends of the first inner conductive structure and the first and second conductive end structures, and
wherein the first set of first conductive structures, the first conductive end structure, and the second conductive end structure form portions of a short-type calibration standard.

6. The set of calibration standards of claim 1, further comprising:
a second set of second conductive structures fabricated on the surface of the substrate, wherein the second conductive structures include a second inner conductive structure, a third outer conductive structure positioned to one side of the second inner conductive structure, and a fourth outer conductive structure positioned to an opposite side of the second inner conductive structure, and wherein the second conductive structures are aligned in parallel with each other and along the principal axes of the first conductive structures, and wherein the first conductive structures are spatially separated from the second conductive structures at the surface of the substrate; and
a second conductive end structure electrically connected between a first end of the third outer conductive structure and a first end of the fourth outer conductive structure, wherein the second conductive end structure is spatially separated from a first end of the second inner conductive structure at the surface of the substrate.

7. The set of calibration standards of claim 6, wherein the first set of first conductive structures, the second set of second conductive structures, the first conductive end structure, and the second conductive end structure form portions of an open-type calibration standard.

8. The set of calibration standards of claim 6, further comprising:
resistive loads electrically connected between the first inner conductive structure and each of the first and second outer conductive structures, and between the second inner conductive structure and each of the third and fourth outer conductive structures,
wherein the first set of first conductive structures, the second set of second conductive structures, the first conductive end structure, the second conductive end structure, and the resistive loads form portions of a load-type calibration standard.

9. The set of calibration standards of claim 1, further comprising:
one or more conductive vias formed in the substrate between the first conductive end structure and a ground structure.

10. The set of calibration standards of claim 1, wherein the first conductive end structure is integrally formed with the first and second outer conductive structures from a same material as the first and second outer conductive structures.

11. The set of calibration standards of claim 1, wherein a width of a portion of the first conductive end structure that is connected to the first outer conductive structure is equal to a width of the first end of the first outer conductive structure.

12. The set of calibration standards of claim 1, wherein a width of a portion of the first conductive end structure that is connected to the first outer conductive structure is less than a width of the first end of the first outer conductive structure.

13. The set of calibration standards of claim 1, wherein the substrate is a wafer on which a device to be tested is fabricated.

14. The set of calibration standards of claim 1, wherein the substrate is a substrate that is separate from a device to be tested.

15. A method for fabricating a set of calibration standards, the method comprising the steps of:
providing a substrate having a surface;
forming a first set of first conductive structures on the surface of the substrate, wherein the first conductive structures include a first inner conductive structure, a first outer conductive structure positioned to one side of the first inner conductive structure, and a second outer conductive structure positioned to an opposite side of the first inner conductive structure, and wherein the first conductive structures are aligned in parallel with each other along offset principal axes of the first conductive structures; and
forming a first conductive end structure on the surface of the substrate and electrically connected between a first end of the first outer conductive structure and a first end of the second outer conductive structure, wherein the first conductive end structure is spatially separated from a first end of the first inner conductive structure at the surface of the substrate.

16. The method of claim 15, further comprising:
forming a second conductive end structure on the surface of the substrate and electrically connected between a second end of the first outer conductive structure and a second end of the second outer conductive structure, wherein the second conductive end structure is spatially separated from a second end of the first inner conductive structure at the surface of the substrate, and
wherein the first set of first conductive structures, the first conductive end structure, and the second conductive end structure form portions of a type of calibration standard selected from a group of calibration standards consisting of a thru-type calibration standard, a line-type calibration standard, and a short type calibration standard.

17. The method of claim 15, further comprising:
forming a second set of second conductive structures on the surface of the substrate, wherein the second conductive structures include a second inner conductive structure, a third outer conductive structure positioned to one side of the second inner conductive structure, and a fourth outer conductive structure positioned to an opposite side of the second inner conductive structure, and wherein the second conductive structures are aligned in parallel with each other and along the principal axes of the first conductive structures, and wherein the first conductive structures are spatially separated from the second conductive structures at the surface of the substrate; and
forming a second conductive end structure on the surface of the substrate and electrically connected between a first end of the third outer conductive structure and a first end of the fourth outer conductive structure, wherein the second conductive end structure is spatially separated from a first end of the second inner conductive structure at the surface of the substrate, and wherein the first set of first conductive structures, the second set of second conductive structures, the first conductive end structure, and the second conductive end structure form portions of an open-type calibration standard.

18. The method of claim 15, wherein the substrate includes a ground structure, and the method further comprises:

forming one or more conductive vias in the substrate between the first conductive end structure and the ground structure.

19. The method of claim 15, wherein providing the substrate comprises providing a wafer on which a device to be tested is fabricated.

20. The method of claim 15, wherein providing the substrate comprises providing a substrate that is separate from a device to be tested.

21. A method for using a set of calibration standards with a testing system configured to test electrical characteristics of an integrated circuit device, the method comprising the steps of:

providing a set of calibration standards that includes
a substrate having a surface,
a first set of first conductive structures fabricated on the surface of the substrate, wherein the first conductive structures include a first inner conductive structure, a first outer conductive structure positioned to one side of the first inner conductive structure, and a second outer conductive structure positioned to an opposite side of the first inner conductive structure, and wherein the first conductive structures are aligned in parallel with each other along offset principal axes of the first conductive structures, and
a first conductive end structure electrically connected between a first end of the first outer conductive structure and a first end of the second outer conductive structure, wherein the first conductive end structure is spatially separated from a first end of the first inner conductive structure at the surface of the substrate;

contacting probes of the testing system with probe contact areas of the first conductive structures;
providing excitation signals through the probes;
measuring responsive signals through the probes; and
analyzing the responsive signals to determine electrical characteristics of the testing system.

22. The method of claim 21, further comprising:
generating an error model of the testing system based on the electrical characteristics of the testing system; and
determining electrical parameters of the integrated circuit device using the testing system and based on the error model of the testing system.

23. The method of claim 22, further comprising:
determining whether the electrical parameters of the integrated circuit device compare unfavorably to device specifications.

24. The method of claim 23, further comprising:
when the electrical parameters compare unfavorably to the device specifications, modifying a design of the integrated circuit device.

25. The method of claim 23, further comprising:
when the electrical parameters compare unfavorably to the device specifications, rejecting the integrated circuit device.

* * * * *